US006914513B1

(12) United States Patent
Wahlers et al.

(10) Patent No.: US 6,914,513 B1
(45) Date of Patent: Jul. 5, 2005

(54) MATERIALS SYSTEM FOR LOW COST, NON WIRE-WOUND, MINIATURE, MULTILAYER MAGNETIC CIRCUIT COMPONENTS

(75) Inventors: Richard L. Wahlers, Churchville, PA (US); Cornelius Y. D. Huang, Blue Bell, PA (US); Alvin H. Feingold, West Chester, PA (US); Merrill R. Heinz, Devon, PA (US); Michael Alan Stein, King of Prussia, PA (US)

(73) Assignee: Electro-Science Laboratories, Inc., King of Prussia, PA (US)

( * ) Notice: Subject to any disclaimer, the term of this patent is extended or adjusted under 35 U.S.C. 154(b) by 1 day.

(21) Appl. No.: 10/288,940

(22) Filed: Nov. 6, 2002

Related U.S. Application Data

(60) Provisional application No. 60/337,289, filed on Nov. 8, 2001.

(51) Int. Cl.$^7$ ................................................ H01F 17/04
(52) U.S. Cl. ........................ 336/233; 336/177; 336/200; 336/219; 336/232
(58) Field of Search ................................. 336/177, 200, 336/232, 233, 219; 428/210

(56) References Cited

U.S. PATENT DOCUMENTS

| | | | |
|---|---|---|---|
| 3,833,872 A | | 9/1974 | Marcus et al. |
| 4,547,961 A | | 10/1985 | Bokil et al. |
| 5,312,674 A | | 5/1994 | Haertling et al. |
| 5,349,743 A | | 9/1994 | Grader et al. |
| 5,532,667 A | * | 7/1996 | Haertling et al. ........... 336/177 |
| 6,054,914 A | | 4/2000 | Abel et al. |
| 6,198,374 B1 | | 3/2001 | Abel |

OTHER PUBLICATIONS

*A Design of Experiment for a Tape Casting Process*, Berry et al., Proc. 2000 International Symposium on Microelectronics, Boston, MA Sep. 20–22, pp. 150–155.

(Continued)

*Primary Examiner*—Cathy F. Lam
(74) *Attorney, Agent, or Firm*—Weingarten, Schurgin, Gagnebin & Lebovici LLP

(57) ABSTRACT

This invention describes materials system and processing conditions for manufacturing magnetic circuit components such as induction coils and transformers that are non wire-wound, miniature in size and, have a low manufacturing cost. The materials system of this invention is comprised of: (1) Low Temperature Cofire Ceramic (LTCC) tapes or thick film pastes of ferromagnetic ceramics with a 20 to 750 range of magnetic permeability to form the magnetic core of the components, (2) Thick film buried silver conductor paste to form the planar induction coils on individual magnetic layers, (3) Thick film via-fill silver conductor paste to interconnect two or more of the planar induction coils through the thickness of the magnetic layers, (4) Thick film silver solderable top layer conductor paste compatible with the ferrite and, (5) Thick film dielectric paste with low magnetic permeability to redirect the magnetic flux for enhancing the magnetic coupling coefficient and to insulate the silver conductors for enhancing the dielectric breakdown voltage. The key characteristics of the materials system of this invention that facilitate manufacture of low cost non wire-wound, miniature magnetic circuit components are: (1) Mutual compatibility essential for either of the techniques, the cofire technique or the sequential technique, used for manufacturing multilayer hybrid microelectronic components, (2) Complementary thermo-physical properties such as shrinkage and thermal expansion coefficient essential for manufacturing flat multilayer magnetic components, (3) Magnetic components with magnetic coupling coefficients greater than 0.95 under optimal processing conditions and, (4) Magnetic components with dielectric breakdown voltage greater than 500V/mil under optimal processing conditions.

17 Claims, 4 Drawing Sheets

Typical cut piece of the LTCC ferrite tape with
the screen-printed thick film dielectric covering
the screen-printed thick film silver conductor.

OTHER PUBLICATIONS

*Lead–Free Multilayer Dielectric System for Telecommunications*, Wahlers, et al., 103$^{rd}$ Annual Meeting and Exposition, The American Ceramic Society, Indianapolis, IN, Apr. 22–25, 2001, (oral presentation, no published version).

*Lead Free Dielectric Tape System for High Frequency Applications*, Feingold, et al., Proc. 2001 International Symposium on Microelectronics, Baltimore, MD, Oct. 9–11, pp. 133–137.

*Low Profile Transformers Using Low Temperature Co–Fire Magnetic Tape*, Bielawski, et al., Telecom Hardware Solutions 2002, Plano, TX, May 15–16 (oral presentation, no published version).

*Capacitor and Inductor Compositions for Buried Components*, Feingold, et al., IMAPS—The International Microelectronics and Packaging Society, Advanced Technology Workshop on Passive Integration, Ogunquit, ME, Jun. 19–21, 2002, (oral presentation, no published version).

*Compliant Dielectric and Magnetic Materials for Buried Components*, Feingold, et al., IMAPS. Keystone 2002 Symposium, Bethlehem, PA, Jun.6, 2002 (oral presentation, no published version).

*Low Profile LTCC Transformers*, Wahlers, et al., Proc. 2002 International Symposium on Microelectronics, Denver, CO, Sep. 4–6, pp. 76–80.

* cited by examiner

Typical cut piece of the LTCC ferrite tape.

Typical cut piece of the LTCC ferrite tape with punched vias.

Typical cut piece of the LTCC ferrite tape with the screen-printed thick film silver conductor.

Typical cut piece of the LTCC ferrite tape with the screen-printed thick film dielectric covering the screen-printed thick film silver conductor.

Figure 2A, Magnetic permeability = 100
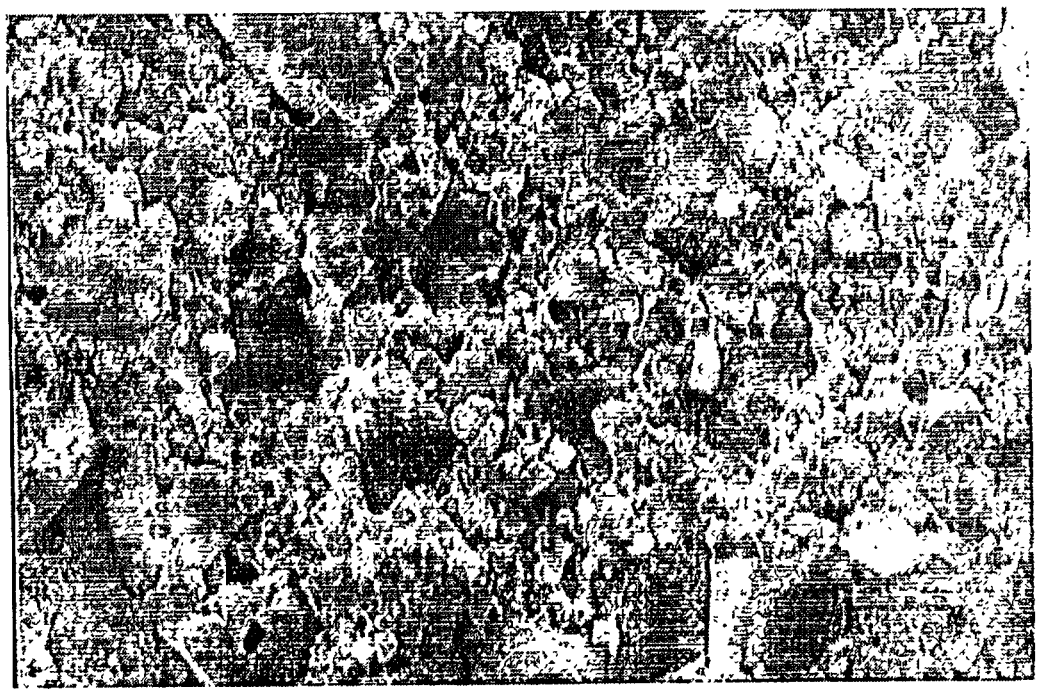
Figure 2B, Magnetic permeability = 178

Figure 2C, Magnetic permeability = 258
Figure 2D, Magnetic permeability = 378

MATERIALS SYSTEM FOR LOW COST, NON WIRE-WOUND, MINIATURE, MULTILAYER MAGNETIC CIRCUIT COMPONENTS

CROSS REFERENCE TO RELATED APPLICATIONS

This application claims priority from U.S. Provisional Patent Application Ser. No. 60/337,289, filed Nov. 8, 2001, which is incorporated in its entirety herein.

STATEMENT REGARDING FEDERALLY SPONSORED RESEARCH OR DEVELOPMENT

N/A

BACKGROUND OF THE INVENTION

Traditional miniature wire-wound magnetic circuit components are relatively simple in design compared to the miniature multilayer magnetic components manufactured using the materials system of this invention. Unfortunately this simple design of the traditional miniature wire-wound magnetic components is not conducive towards current trend of increased functionality and integration in electronic design and manufacturing of the circuit boards so as to reduce cost, size and, weight of the device. In the traditional miniature wire-wound magnetic component a very tiny wire is wound around a magnetic core to form the induction coil. Automation of the coil winding process is not feasible for such very small sized components. Hence manufacturing of such very small sized components is costly due to the use of a labor-intensive manual wire-winding process. By design, these miniature magnetic circuit components have following two shortcomings: (1) too large a form factor (height in relation to base of a component mounted on the circuit board) compared to that of the chip scale components needed for size and weight reduction of electronic devices of today and tomorrow and (2) cannot be integrated into the typical multilayer microelectronic manufacturing process to design a multi-functional/increased functionality component with inductive as well as capacitive and/or resistive functions for potential lowering of cost, size and weight of the electronic device. This approach to potential cost reduction by increasing the functionality of a device is well known to those knowledgeable in the art of hybrid microelectronics and semiconductor devices and packages. Part of this trend is being accomplished by an ongoing increased level of integration on the IC (Integrated Circuit) chips by the semiconductor manufacturers. Even so a large number of passive components are needed to interconnect and support these ICs. Thus, there is an ongoing effort to miniaturize these passive components so as to reduce the size and weight of the circuit board. Miniaturization of resistors and capacitors has been accomplished by utilizing techniques such as discrete surface mounted chip components and thick film buried components. Miniaturization of the conventional wire-wound magnetic components such as inductors and transformers has been conceptually demonstrated by replacing the wire-wound induction coil with a multilayer microelectronic design that uses a thick film conductor deposited on laminated layers of a ferromagnetic ceramic to form the induction coil of the magnetic component. These multilayer magnetic components are manufactured in accordance with processing steps typical of LTCC and thick film technologies. Compared to the conventional wire-wound miniature magnetic component the multilayer component design has following advantages: (1) magnetic component with a chip scale form factor for potential reduction in circuit size and weight, (2) potential to lower manufacturing cost by process automation and, (3) potential for additional lowering of device cost with increased functionality by integrating inductive as well as capacitive and/or resistive functions on a component.

U.S. Pat. Nos. 5,312,674; 5,349,743 and 6,054,914 disclose designs and methods for manufacturing non wire-wound, monolithic, multilayer transformers (magnetic circuit components) using Low Temperature Cofired Ceramic (LTCC) technology and High Temperature Cofired Ceramic Technology. A thick film paste or ceramic green tape of a ferromagnetic material is used to form a single magnetic layer. Each layer acts as a substrate for the next layer in the sequential build-up of the multilayer magnetic component. Pluralities of such magnetic layers are laminated on top of each other to form the multilayer transformer. When using thick film paste of the ferromagnetic material, the multilayer magnetic component is manufactured by laminating individual layers of a dielectric ceramic green tape screen-printed with the ferromagnetic paste. Thick film conductors are screen-printed on individual magnetic layers to form a part of the electrical winding of the transformer. The primary and the secondary windings can be placed on the same magnetic layer or spread vertically over several magnetic layers through the multilayer component. When such windings extend over more than one magnetic layer vias or holes are provided at appropriate locations through the magnetic layers to facilitate interconnection between the windings on different magnetic layers. These vias are filled with the thick film conductor to complete the electrical interconnection. In accordance with the typical multilayer component design and manufacturing procedure each layer is independently punched with v as and screen-printed with appropriate thick film pastes as needed. Then all of these layers are laminated in appropriate sequence to form a green multilayer component package that is fired into an integral structure at an appropriate high temperature.

U.S. Pat. No. 6,198,374 discloses use of a lower permeability dielectric on Nickel-Zinc-ferrite (Ni—Zn ferrite) layers to improve the magnetic coupling coefficient of a multilayer transformer and to improve the dielectric breakdown voltage between the adjacent conductor layers in the multilayer transformer. Without the use of the lower permeability dielectric, the transformer design shown in U.S. Pat. No. 6,198,374 has uniform magnetic permeability throughout the multilayer structure with calculated theoretical magnetic coupling coefficient of 0.83 and a breakdown voltage of 2400VAC with a 7-mil thick ferrite layer (345VAC/mil for a 7-mil thick ferrite layer). By applying the low permeability dielectric over the thick film conductor in specific areas the magnetic coupling coefficient of such a transformer is improved to approximately 0.95 with improved dielectric breakdown voltage.

The concept of non wire-wound magnetic components dates back over a decade as shown in U.S. Pat. Nos. such as U.S. Pat. Nos. 3,833,872 and 4,547,961. During these past few years have appeared miniature multilayer non wire-wound transformers. These multilayer transformers of earlier inventions used materials systems that were not necessarily optimized for such applications. As a result multilayer transformers manufactured with these existing materials systems had shortcomings in at least one of the following typical application requirements for a miniature magnetic circuit component: (1) Magnetic coupling coefficient less than 0.95, (2) Dielectric breakdown voltage less than 1500V, a typical value for a miniature wire-wound transformer (3)

Form factor larger than chip-scale, i.e. thickness of the transformer in relationship to its area for mounting on a circuit board (4) Commercially proven multilayer magnetic component design and, (5) Higher or comparable cost compared to typical miniature wire-wound transformers. These shortcomings have contributed to the slow pace of commercialization of this multilayer technique towards miniaturization and replacement of conventional wire-wound magnetic components such as inductors and transformers.

Tape casting, also known as doctor blade casting or knife casting is a well known technique used for casting thin, flat, sheets of a ceramic material using a slip of the said material. The tape casting slip consists of organic and inorganic components. In accordance with their function in a tape casting slip these components can be classified as follows: (1) The primary ceramic powder, (2) Fluxes and sintering aids to assist in densification of the fired ceramic, (3) Fillers or additives to adjust application specific properties of the fired ceramic, (4) Resin to bond all the inorganic particulates together in the green or dry, unfired state, (to form a green tape), (5) Plasticizers to modify the properties of the resin so as to make the ceramic green tape flexible for forming or shaping and laminating, (6) Solvents as a medium to dissolve the resins and plasticizers and suspend the inorganic particulates to form the slip and, (7) Surfactants to facilitate homogeneous dispersion of the particulates in the slip. In a basic tape casting process a doctor blade is used to uniformly spread the slip over a moving carrier film made of materials such as silicone coated polyester. A ceramic green tape is obtained by evaporating the solvent from the wet film. The left over resin and plasticizer hold the ceramic particulates together while providing sufficient flexibility to the ceramic green tape for subsequent forming operations such as cutting to desired size and shape, drilling holes and, lamination of multiple layers of the ceramic green tape to form a multi-layer ceramic green tape package (green package). After all of the forming operations are complete the green package is processed at an appropriate high temperature using a material specific time-temperature firing protocol (firing profile) to burn-off the remaining organic components and sinter and densify the remaining inorganic components to form the fired multilayer ceramic package (fired package). During this entire process, beginning with making of the slip to cooling of the fired package to ambient, all materials and processing related variable factors can potentially influence the properties of the resultant fired package. With reference to one specific application Berry et al. ("A Design of Experiment for a Tape Casting Process", C. Berry et. al, Proc. 2000 International Symposium on Microelectronics, pp.150–155) identified over forty possible variable factors in the tape casting process and by utilizing the design of experiments technique concluded that only six of these factors were critical for manufacturing LTCC tapes with acceptable consistency and repeatability for their application.

A typical thick film ink or paste for screen-printing contains, at minimum, particulates of an inorganic active ingredient suspended in an organic screening agent also known as vehicle. A typical screening agent is a solution of a high molecular weight polymer dissolved in a high boiling point alcohol. The ink is processed in accordance with the typical print and fire thick film technique to obtain a fired film of the active inorganic ingredient on a substrate. The sintered active ingredient dominates the electrical properties of the fired film. In practice the performance of the fired film is also affected by materials related variables such as shape and size of the particulates, chemical reactivity and concentration of the solid phases in the film. Usually thick film pastes are classified in accordance with their intended application and as such the dominant active ingredient has electrical properties typical of that general class of materials.

Following flow chart illustrates the typical procedural steps generally carried out in LTCC processing of a microelectronic multilayer magnetic component.

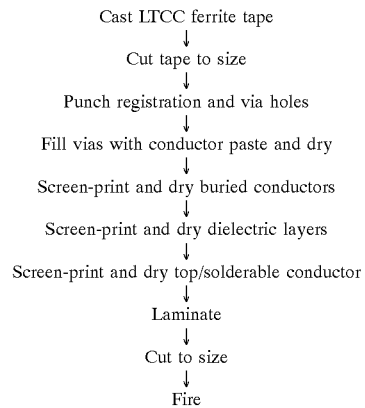

Typical LTCC process flow chart

Cast LTCC ferrite tape
↓
Cut tape to size
↓
Punch registration and via holes
↓
Fill vias with conductor paste and dry
↓
Screen-print and dry buried conductors
↓
Screen-print and dry dielectric layers
↓
Screen-print and dry top/solderable conductor
↓
Laminate
↓
Cut to size
↓
Fire When using a thick film ferrite paste to fabricate the multilayer magnetic component the same general procedure is followed except a substrate is used as a base for the multilayer component and the thick film ferrite and conductors are deposited layer-by-layer per the part design. The layers may be separately fired or cofired. In the separate firing process each layer is deposited and fired and forms the basis for the next layer in the part build up.

BRIEF SUMMARY OF THE INVENTION

This invention relates to a materials system comprised of following five mutually compatible components, (1) Low Temperature Cofire Ceramic (LTCC) ferrite tape or thick film ferrite paste, (2) Thick film buried silver conductor paste, (3) Thick film via-fill silver conductor paste, (4) Thick film solderable top layer silver conductor paste and, (5) Thick film dielectric paste which can be processed using typical LTCC and thick film techniques at peak temperatures below 950° C. to fabricate defect free, flat multilayer magnetic components with magnetic coupling coefficient greater than 0.95 and dielectric breakdown voltage between adjacent elements greater than 500V/mil.

A Nickel-Copper-Zinc (Ni—Cu—Zn) ferrite powder is the material of preference for this invention because it can be fired in air and densified at relatively lower peak firing temperatures in the range of 800° C. to 950° C. The LTCC ferrite tape and the thick film ferrite paste of this invention have magnetic permeability in the range of 25 to 750.

The three thick film silver conductor pastes of this invention, the buried silver conductor paste, the via-fill silver conductor paste and, the solderable top layer silver conductor paste are compatible with the LTCC ferrite tape and ferrite paste of this invention. The buried silver conductor is used to form planar induction coils buried or sandwiched between ferrite layers. The via-fill silver conductor is used to interconnect two or more of the planar, buried silver coils through the thickness of the ferrite layers. The top solderable silver conductor is used to connect the multilayer magnetic component to the circuit board.

The thick film dielectric of this invention is compatible with the ferrite and the thick film conductors of this invention and can be cofired with these materials. The magnetic permeability of this dielectric is less than that of the ferrite used in this invention. The dielectric is screen-printed as a protective film on top of the buried silver conductor. The presence of this dielectric helps in redirecting the magnetic flux around the buried silver induction coil there by enhancing the magnetic coupling coefficient for the miniature multilayer magnetic component. The dielectric film also acts as an insulator between adjacent buried silver conductor lines there by enhancing the dielectric characteristics of interest in applications of multilayer magnetic components.

In the preferred embodiment of this invention factors that enhance the dielectric characteristics such as breakdown voltage, insulation resistance and surge resistance are: use of $Bi_2O_3$ as a sintering aid in the ferrite, higher peak firing temperature of the multilayer package, reduced concentration of solids in the thick film buried silver conductor paste, presence of a grain growth inhibitor in the thick film buried silver conductor paste and, thickness of the dielectric film.

BRIEF DESCRIPTION OF THE FIGURES

FIG. 2 shows micrographs (taken on a scanning electron microscope, with all micrographs having the same magnification) showing that the ferrite body with larger grain size has higher magnetic permeability. The magnetic permeability of the figures (in $\mu_m$) are: A: 100; B: 178; C: 258; D: 378.

Figure 1A:
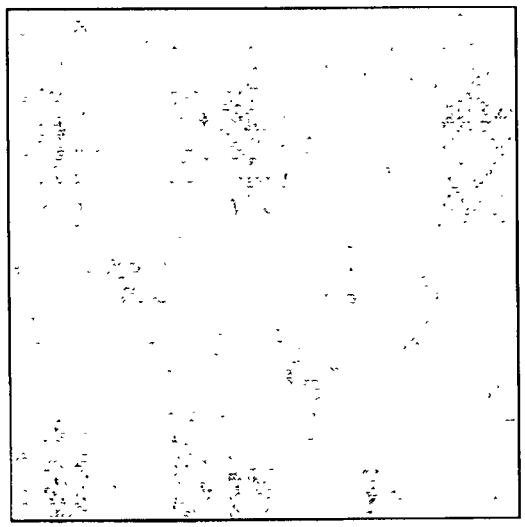
FIG. 1A shows a typical cut piece of LTCC ferrite tape.

Table 1 shows that magnetic permeability at different peak firing temperatures.

Table 2 shows BDV at different concentrations of $Bi_2O_3$.

Table 3 shows various properties at different peak temperatures.

Table 4 shows properties at relatively high and low concentrations of solids in silver paste.

Table 5 shows properties in paste with and without grain growth inhibitor.

Table 6 shows BDV at different film thicknesses of dielectric.

Table 7 shows insulation resistance at different thicknesses of dielectric film.

DETAILED DESCRIPTION OF THE INVENTION

The materials system and processing conditions of this invention overcome the shortcomings of the prior art, thereby facilitating commercialization of miniature multilayer magnetic components. Using the materials system and processing conditions of this invention prototype miniature multilayer magnetic components with magnetic coupling coefficients greater than 0.95, dielectric breakdown voltages greater than 500V/mil and, low chip-scale form factor have been fabricated. Furthermore, the use of proven, thick film and LTCC techniques that can be automated and are not as labor-intensive should lower the cost of manufacturing such miniature multilayer magnetic components when compared to the current, labor-intensive manual wire-winding process.

A. Typical Manufacturing of LTCC Tapes and Thick Film Pastes

The constituents of all Low Temperature Cofire Ceramic (LTCC) tapes and thick film pastes can be classified into two broad chemical categories: inorganic and organic. The final fired ceramic is a product of the chemical reaction between the particulates of the inorganic constituents, usually referred to as solids in a tape casting slip, a LTCC tape or a thick film paste. The organic components act as a delivery medium for the solids by facilitating handling and deposition of the inorganic particulates in the desired shape and layout of the circuit for the intended microelectronic application.

A typical LTCC tape manufacturing process starts off by preparing a homogeneous, stable tape casting slip, which is a suspension of the inorganic solids in the organic medium. This is accomplished by processing all of the ingredients in a ball mill. The organics are comprised of solvents, resins, plasticizers and surfactants. The inorganics are comprised of the primary or dominant phase, fluxes or sintering aids, and fillers. In a tape casting slip the organics facilitate uniform spreading and deposition of the slip over a moving carrier film such as silicone-coated polyester. After deposition, the film is dried by evaporating some of the solvent and allowing the remainder of the organics to bind the solids together to form a flexible, strong LTCC tape of inorganic solids held together in an organic polymer matrix loosely adhered to the carrier film. The rheology of the slip and the flexibility of the LTCC tape are governed by the organics that are selected in accordance with the intended application for the LTCC tape.

A typical thick film paste manufacturing process starts off by dissolving the polymer in the solvent to form a homogeneous fluid known as organic screening agent or vehicle. Next, by means of a three-roll mill the inorganic solids are uniformly dispersed in the organic screening agent to form a homogeneous suspension called thick film paste. In thick film pastes the organics facilitate screen-printing of the paste in a defined pattern on a substrate. After screen-printing the paste deposit is dried by evaporating some of the solvent and allowing the remainder of the organics to bind the solids together as a film adhered to the substrate. The rheology of the paste is governed by the organics that are selected in accordance with the intended application for the paste.

The rheology or viscosity of the tape casting slip and the thick film paste is measured using a viscometer.

B. LTCC Ferrite Tape

The primary constituent of a LTCC ferrite tape is a ferrite powder chosen in accordance with the intended application. The LTCC ferrite tape of this invention is compatible with and can be cofired with other embodiments of this invention: the thick film ferrite paste, the thick film buried silver conductor paste, the thick film via-fill silver conductor paste, the thick film solderable top layer conductor paste and, the thick film dielectric paste. In the preferred embodiment of this invention the LTCC ferrite tape can be fired in air below 950° C.

This invention relates in part to Nickel-Zinc (Ni—Zn) LTCC ferrite tape with magnetic permeability in the range 20 to 750. Additional components (e.g., Cu; see below) can be incorporated in the ferrite tape. A Nickel-Copper-Zinc (Ni—Cu—Zn) ferrite powder is the material of preference for this invention because it can be fired in air and densified at relatively lower peak firing temperatures in the range 800° C. to 950° C. Additives such as fluxes or sintering aids used to promote densification of the Ni—Cu—Zn ferrite include $Bi_2O_3$, $B_2O_3$, PbO, CuO, $V_2O_5$, ZnO and low melting glasses. The preferred flux of this invention is $Bi_2O_3$. Additives such as CaO, $Nb_2O_5$ and, $SiO_2$ are used as fillers to modify the electrical and magnetic properties of the ferrite so as to satisfy the application requirements. In the preferred embodiment of this invention the concentration of such additives is kept below 15%. From the commercially available wide selection of resins, plasticizers, solvents and, surfactants, those materials that are compatible with each other and with the ferrite, fluxes and, additives being used are selected for making the ferrite tape casting slip of this invention. The resins used include polyvinyl butyral and acrylic polymers. The plasticizers used include butyl benzyl phthalate and polyethylene glycols. High boiling point alcohols and aromatic hydrocarbons are used as solvents. The surfactants of choice are fish oils and phosphates. Materials related variables critical to the application and performance of the LTCC ferrite tape are: (1) Size of the ferrite particulates in the slip, (2) Particulate size and concentration of the flux, (3) Particulate size and concentration of the filler, (4) Thickness of the LTCC ferrite tape and, (5) Peak firing temperature for the multilayer package. In the preferred embodiment of this invention these critical variables have been optimized so as to enhance the following performance characteristics of the miniature magnetic components: (1) Magnetic coupling coefficient (2) Insulation resistance, (3) Surge resistance and, (4) Dielectric breakdown voltage. The LTCC ferrite tapes of this invention can be fired in air below 950° C. to manufacture flat miniature multilayer magnetic components with magnetic coupling coefficient greater than 0.95 and dielectric breakdown voltage greater than 500V/mil.

In the preferred embodiment of this invention the LTCC ferrite tape is comprised of (all concentrations being approximate and expressed in percent weight):

(a) 52 to 75% Ni—Cu—Zn ferrite powder composed of 5 to 10% Ni, 1 to 5% Cu, 10–20% (preferably 15 to 20%) Zn, 40 to 50% Fe and balance O, (the total solids level being 84–99% (preferably 90–98%), with magnetic permeability in the range of 25 to 750 and average particle size in the range of 0.2 to 5 microns, preferably 0.5 to 2 microns, (b) approximately 0.2 to 5% (preferably approximately 1–5% and more preferably approximately 1.25–3%) $Bi_2O_3$ as a flux or sintering aid with an average particle size in the range of 0.2 to 5 microns, preferably 0.5 to 2 microns, (c) 0 to 5% (preferably 0.1–5%) PbO as a flux or sintering aid with an average particle size in the range of 0.2 to 5 microns, preferably 0.5 to 2 microns (d) 0 to 3% $SiO_2$ as filler, with an average particle size in the range of 0.2 to 5 microns, preferably 0.2 to 2 microns, (e) 2 to 10% resin, (e.g. poly vinyl butyral)

(f) 1 to 5% plasticizer, (e.g. poly ethylene glycol)

(g) 15 to 40 % solvent (e.g. a mixture of methyl ethyl ketone and ethanol (60:40) and, (h) 0 to 1% surfactant (e.g. Menhaden fish oil or phosphate ester.

(Note: examples of ingredients are generally mentioned only the first time a category of component is discussed herein. These ingredients are also suitable examples when the component is later discussed.)

It will be apparent to those knowledgeable in the art that other ferrites, fluxes and fillers can also be used in place of the preferred materials of this invention, for example Mn—Zn ferrite, fluxes such as $B_2O_3$, PbO, CuO, $V_2O_5$, ZnO and low melting glasses with softening point less than 700° C. and, fillers such as CaO and $Nb_2O_5$.

Sintering aids and fluxes like $Bi_2O_3$, $B_2O_3$, PbO, CuO, $V_2O_5$, ZnO, low melting glasses, etc. can be added to reduce the firing temperature. Excessive amounts reduce the permeability so additive concentrations are usually kept under 15%. Most preferred levels of $Bi_2O_3$ range from 1.25 to 2.5%.

Typical ceramic particle size reduction techniques are used to obtain finely divided powders of the inorganic solids with uniform particle size distributions.

In the preferred embodiment of this invention, room temperature (23° C. to 27° C.) viscosity of the ferrite slip for tape casting is in the range of 1,000 to 4,000 cP, preferably 1,800 to 2,200 cP, at 10 RPM using a Number 4 disc spindle on Brookfield RVT viscometer.

The ferrite slip is deposited using a doctor blade on a moving carrier film and dried to form the LTCC ferrite tape. A carrier film such as silicone-coated polyester facilitates removal of the LTCC ferrite tape for subsequent typical LTCC manufacturing steps for multilayer microelectronic components. Several slip and casting process related variable parameters such as concentration of solids in the slip, rheology of the slip, height of the doctor blade and, speed of the carrier film determine the quality or physical characteristics of the LTCC ferrite tape such as average thickness of the tape and the uniformity of this average thickness across entire cast length of the tape. In the preferred embodiment of this invention the average thickness of the LTCC ferrite tape is 1 to 12 mils (25 to 300 microns). The desired average thickness of the tape and its uniformity depends on its intended application.

C. Thick Film Ferrite Paste

The primary constituent of a thick film ferrite paste is a ferrite powder chosen in accordance with the intended application. The thick film ferrite paste of this invention is compatible with and can be cofired with other embodiments of this invention: the LTCC ferrite tape, the thick film buried silver conductor paste, the thick film via-fill silver conductor paste, the thick film solderable top layer silver conductor paste and, the thick film dielectric paste. In the preferred embodiment of this invention the thick film ferrite paste can be fired in air below 950° C.

This invention relates in part to Nickel-Zinc (Ni—Zn) thick film ferrite paste with magnetic permeability in the range 20 to 750. Additional components (e.g., Cu; see below) can be incorporated in the ferrite paste. The Nickel-Copper-Zinc (Ni—Cu—Zn) ferrite powder is the material of preference for this invention because it can be fired in air and densified at relatively lower peak firing temperatures in the range 800° C. to 980° C. Additives such as fluxes or sintering aids used to promote densification of the Ni—Cu—Zn ferrite include $Bi_2O_3$, $B_2O_3$, PbO, CuO, $V_2O_5$, ZnO and low melting glasses. The preferred flux of this invention is $Bi_2O_3$. Additives such as CaO, $Nb_2O_5$ and, $SiO_2$ are used as fillers to modify the electrical and magnetic properties of the ferrite so as to satisfy the application requirements. In the preferred embodiment of this invention the concentration of such additives is kept below 20%. The thick film ferrite paste consists of particulates of the ferrite, flux and filler suspended in a screening agent. The screening agent of choice is a solution of ethyl cellulose dissolved in a high boiling point alcohol. Materials related variables critical to the application and performance of the thick film ferrite paste are: (1) Size of the ferrite particulates, (2) Particulate size and concentration of the flux, (3) Particulate size and concentration of the filler, (4) Concentration of the solids in the paste and, (5) Peak firing temperature for the ferrite. In the preferred embodiment of this invention these critical variables have been optimized so as to enhance the following performance characteristics of the miniature magnetic components: (1) Magnetic permeability (2) Insulation resistance, (3) Surge resistance and, (4) Dielectric breakdown voltage. The thick film ferrite pastes of this invention can be fired in air below 950° C. to manufacture miniature multilayer magnetic components with magnetic coupling coefficient greater than 0.95 and dielectric breakdown voltage greater than 500V/mil.

In the embodiment of this invention the thick film ferrite paste is essentially similar to the LTCC tape, but is preferentially comprised of:

(a) 62 to 80% of Ni—Cu—Zn ferrite powder composed of 5 to 10% Ni, 1 to 5% Cu, 15 to 20% Zn, 40 to 50% Fe and balance O, with magnetic permeability in the range of 25 to 750 and average particle size in the range of 0.2 to 5 microns, preferably 0.5 to 2 microns, (b) approximately 0.2 to 5% (preferably approximately 1–5% and more preferably approximately 1.25–3%) $Bi_2O_3$ as a flux or sintering aid with an average particle size in the range of 0.2 to 5 microns, preferably 0.5 to 2 microns, (c) 0.1 to 5% PbO as a flux or sintering aid with an average particle size in the range of 0.2 to 5 microns, preferably 0.5 to 2 microns (d) 0 to 10% glass as a binder with an average particle size in the range of 0.2 to 5 microns, preferably 0.5 to 2 microns (e) 0 to 10% $SiO_2$ as filler, with an average particle size in the range of 0.2 to 5 microns, preferably 0.2 to 2 microns, (f) 1 to 5% ethyl cellulose as resin and, (g) 14 to 35% high boiling point alcohol (e.g. TEXANOL (a trademark of Kodak) or 2,2,4-Trimethyl-1,3-pentanediol Monoisobutyrate) as solvent and, It will be apparent to those knowledgeable in the art that other ferrites, fluxes and fillers can also be used in place of the preferred materials of this invention, for example Mn—Zn ferrite, fluxes such as $B_2O_3$, CuO, $V_2O_5$, ZnO and low melting glasses with softening point less than 700° C. and, fillers such as CaO and $Nb_2O_5$.

Typical ceramic particle size reduction techniques are used to obtain finely divided powders of the inorganic solids with uniform particle size distributions.

In the preferred embodiment of this invention, room temperature (23° C. to 27° C.) viscosity of the thick film ferrite paste is in the range of 150 to 300 kcP at a shear rate of 1.05/sec, using a cylindrical spindle on Brookfield RVT viscometer.

The thick film ferrite paste is deposited in the desired layout or pattern on a substrate by the screen-printing technique. Several paste and screen-printing related variable parameters such as concentration of solids in the paste, rheology of the paste, mesh count of the screen and thickness of the screen determine the quality or physical characteristics of the screen-printed ferrite film or print such as thickness and sharpness of the edges of the print.

D. Thick Film Buried Silver Conductor Paste

A silver powder is the primary ingredient in a thick film silver conductor paste. The thick film buried silver conductor paste of this invention is compatible with and can be cofired with other embodiments of this invention: the LTCC ferrite tape, the thick film ferrite paste, the thick film dielectric paste, the thick film via-fill silver conductor paste and, the thick film solderable top layer conductor paste.

The thick film buried silver conductor paste is screen-printed on the ferrite layer to form a planar induction coil. Pluralities of such layers are laminated to form the multilayer magnetic component. The conductor paste is comprised of particulates of silver and a ceramic binder suspended in the screening agent. The screening agent of choice is a solution of ethyl cellulose dissolved in a high boiling point alcohol. In the preferred embodiment of this invention, the thick film buried silver conductor paste consists of silver particulates 1 µm to 10 µm in size. Materials related variables critical to the application and performance of the buried silver thick film conductor paste are: (1) Concentration of silver particulates, (2) Size of silver particulates, (3) Concentration of ceramic binder, (4) Size of ceramic binder particulates and, (5) Chemical compatibility between the ceramic binder and the ferrite. In the preferred embodiment of this invention these critical variables have been optimized so as to enhance the following performance characteristics of the miniature magnetic components: (1) Flatness or warpage of the miniature component, (2) Insulation resistance, (3) Surge resistance and, (4) Dielectric breakdown voltage. The thick film buried silver conductor paste of this invention can be fired in air below 950° C. (preferably about 850–950C.) to manufacture flat, miniature multilayer magnetic components with magnetic coupling coefficient greater than 0.95 and dielectric breakdown voltage greater than 500V/mil.

In the preferred embodiment of this invention the thick film buried silver conductor paste is comprised of:

(a) 65 to 85% silver powder with an average particle size in the range of 1 to 10 microns, preferably 4 to 5 microns, (b) 0 to 3% ceramic binder (e.g. copper oxide, cadmium oxide or glasses) with an average particle size in the range of 1 to 10 microns, preferably 1 to 2 microns, (c) 0 to 2% grain growth inhibitor, (d) 1 to 5% ethyl cellulose as resin and, (e) 14 to 35% high boiling point alcohol as solvent.

In the preferred embodiment of this invention room temperature (23° C. to 27° C.) viscosity of the thick film buried silver conductor paste is in the range of 100 to 300 kcP at a shear rate of 1.05/sec, using a cylindrical spindle on Brookfield RVT viscometer.

The thick film buried silver conductor paste is deposited in the desired layout or pattern by the screen-printing technique on the LTCC ferrite tape or the screen-printed and dried ferrite paste deposit. Several paste and screen-printing related variable parameters such as concentration of solids in the paste, rheology of the paste, mesh count of the screen and thickness of the screen determine the quality or physical characteristics of the screen-printed silver conductor film or print such as thickness and sharpness of the edges of the print.

The thick film buried silver conductor paste forms the planar induction coil sandwiched between the ferrite layers of the miniature multilayer magnetic component. In the preferred embodiment of this invention design specific areas of the buried silver conductor may be covered with the thick film dielectric paste of this invention.

While silver is the preferred conductor in applications where conductivity and cost are the key requirements, Au, Cu, Pt, Pd and alloys of these can be used and are preferred in other applications, ones in which firing must be higher than 960 C. (the melting point of silver). Copper is a good choice for systems which can be fired in inert atmospheres like nitrogen. It, like silver, is inexpensive and has a low value of electrical resistance. In addition, it has a higher melting point than silver.

E. Thick Film via-fill Silver Conductor Paste

A silver powder is the primary ingredient in a thick film silver conductor paste. The thick film via-fill silver conductor paste of this invention is compatible with and can be cofired with other embodiments of this invention: the LTCC ferrite tape, the thick film ferrite paste, the thick film buried silver conductor paste, the thick film solderable top layer silver conductor paste and, the thick film dielectric paste.

The thick film via-fill silver conductor is used to interconnect the different layers of planar thick film buried silver conductor in the multilayer package. The thick film via-fill silver conductor paste is comprised of particulates of silver and a ceramic binder suspended in a screening agent. The screening agent of choice is a solution of ethyl cellulose dissolved in a high boiling point alcohol. In the preferred embodiment of this invention, the thick film via-fill silver conductor paste consists of silver particulates 2 $\mu$m to 12 $\mu$m in size, ceramic binder with particulate size comparable to that of silver and, the screening agent. Materials related variables critical to the application and performance of the thick film via-fill silver conductor paste are: (1) Concentration of silver, (2) Size of silver particulates, (3) Concentration of ceramic binder, (4) Size of ceramic binder particulates, (5) Thermal expansion coefficient of the ceramic binder and, (6) Chemical compatibility between the ceramic binder and the ferrite. In the preferred embodiment of this invention these critical variables have been optimized so as to form reliable electrical interconnects between the buried planar induction coils screen-printed on the ferrite layers of the multilayer magnetic component. The thick film via-fill silver conductor paste of this invention can be fired in air below 950° C. to manufacture flat miniature multilayer magnetic components with magnetic coupling coefficient greater than 0.95 and dielectric breakdown voltage greater than 500V/mil.

In the preferred embodiment of this invention the thick film via-fill silver conductor paste is comprised of:

(a) 63 to 90% silver powder with an average particle size in the range of 1 to 10 microns, preferably 4 to 5 microns, (b) 0 to 5% ceramic binder with an average particle size in the range of 1 to 10 microns, preferably 1 to 2 microns, (c) 1 to 5% ethyl cellulose as resin and, (d) 5 to 35% high boiling point alcohol as solvent.

In the preferred embodiment of this invention, room temperature (23° C. to 27° C.) viscosity of the thick film via-fill silver conductor paste is in the range of 1,000 to 2,000 kcP at a shear rate of 0.1/sec, using a cylindrical spindle on Brookfield RVT viscometer.

The thick film via-fill silver conductor paste is deposited in the vias (or feed-through holes) present in the LTCC ferrite tape or the screen-printed and dried ferrite paste deposit. Several paste and screen-printing related variable parameters such as concentration of solids in the paste, rheology of the paste, mesh count of the screen and thickness of the screen determine the volume of the paste incorporated into the via. The thick film via-fill silver conductor paste interconnects the planar induction coil formed by the thick film buried silver conductor sandwiched between the ferrite layers of the miniature multilayer magnetic component.

F. Thick Film Solderable Top Layer Conductor Paste

A silver powder is the primary ingredient in a thick film silver conductor-paste. The thick film solderable silver conductor paste of this invention is compatible with and can be cofired with other embodiments of this invention: the LTCC ferrite tape, the thick film ferrite paste, the thick film buried silver conductor paste, the thick film via-fill conductor paste and, the thick film dielectric paste.

The thick film solderable top layer silver conductor paste of this invention is designed for solder pad applications on the surface of the miniature multilayer magnetic component. This conductor can be either cofired or separately fired on the ferrite with excellent solderability and leach resistance. The conductor paste is comprised of particulates of precious metal and ceramic binders suspended in a screening agent. The screening agent of choice is a solution of ethyl cellulose dissolved in a high boiling point alcohol. In the preferred embodiment of this invention, the thick film solderable top layer silver conductor paste consists of silver particulates 1 $\mu$m to 4 $\mu$m in size, platinum particulates less than 1 $\mu$m in size, a ceramic binder and, the screening agent. Materials related variables critical to the application and performance of the thick film solderable top layer silver conductor paste are: (1) Concentration of silver, (2) Size of silver particulates, (3) Concentration of platinum, (4) Size of platinum particulates, (5) Concentration of ceramic binder, (6) Size of ceramic binder particulates, (7) Thermal expansion coefficient of the ceramic binder and, (8) Chemical compatibility between the ceramic binder and the ferrite. In the preferred embodiment of this invention these critical variables have been optimized so as to enhance the following performance characteristics of the miniature magnetic components: (1) Flatness or warpage of the miniature component, (2) Insulation resistance, (3) Surge resistance, (4) Dielectric breakdown voltage, (5) Magnetic coupling coefficient and, (6) Quality factor. The thick film solderable top layer silver conductor paste of this invention can be fired in air below 950° C. to manufacture flat miniature multilayer magnetic components with magnetic coupling coefficient greater than 0.95 and dielectric breakdown voltage greater than 500V/mil.

In the preferred embodiment of this invention the thick film solderable top layer silver conductor paste is comprised of:

(a) 55 to 70% silver powder with an average particle size in the range of 1 to 4 (preferably 2 to 3) microns, (b) 2 to 16% (preferably 2 to 6%) platinum powder with an average particle size less than 4 microns, preferably less than 1 micron, (c) 1 to 10% ceramic binder with an average particle size in the range of 1 to 2 microns, (c) 1 to 5% ethyl cellulose as resin and, (d) 14 to 35% high boiling point alcohol as solvent.

Optionally 2 to 6% $Bi_2O_3$ can be included.

In the preferred embodiment of this invention, room temperature (23° C. to 27° C.) viscosity of the thick film solderable top layer silver conductor paste is in the range of 200 to 400 kcP at a shear rate of 1.05/sec, using a cylindrical spindle on Brookfield RVT viscometer.

The thick film solderable top layer silver conductor paste is deposited in the desired layout or pattern by the screen-printing technique on the LTCC ferrite tape or the screen-printed ferrite paste deposit. Several paste and screen-printing related variable parameters such as concentration of solids in the paste, rheology of the paste, mesh count of the screen and thickness of the screen determine the quality or physical characteristics of the screen-printed silver conductor film or print such as thickness and sharpness of the edges of the print. The thick film solderable top layer silver conductor paste is used to form terminal pads essential for soldering the miniature multilayer magnetic component to other parts of the circuit board.

G. Thick Film Dielectric Paste

The primary components of a typical thick film dielectric paste are glasses and fillers chosen in accordance with the intended application. The thick film dielectric paste of this invention is compatible with other embodiments of this invention: the LTCC ferrite tape, the thick film ferrite paste, the thick film buried silver conductor paste, the thick film via-fill silver conductor paste and, the thick film solderable top layer conductor paste.

The thick film dielectric paste of this invention is designed to improve the dielectric characteristics such as breakdown voltage, insulation resistance and surge resistance between the adjacent silver conductor traces buried in the multilayer magnetic component. This dielectric also helps in enhancing the quality factor of the multilayer magnetic component by redirecting the magnetic flux around the thick film buried silver induction coil so as to enhance its magnetic coupling coefficient. Redirection of magnetic flux in the ferrite layers needs a dielectric with magnetic permeability lower than that of the ferrite layers on which the said dielectric is deposited. The dominant ingredients of the dielectric paste are particulates of glasses and ceramic fillers suspended in a screening agent. The screening agent of choice is a solution of ethyl cellulose dissolved in a high boiling point alcohol. In the preferred embodiment of this invention the glasses of choice have thermal expansion coefficient in the range 8 to 11 ppm/° C. and have a working temperature comparable to the peak temperature used for firing the LTCC ferrite tape. Materials related variables critical to the application and performance of the thick film dielectric paste are: (1) Size of glass particulates, (2) Thermal expansion coefficient of glass, (3) Softening point of glass, (4) Size of filler particulates and, (5) Thermal expansion coefficient of filler. In the preferred embodiment of this invention these critical variables have been optimized so as to enhance the following performance characteristics of the miniature multilayer magnetic components: (1) Flatness or warpage of the miniature component, (2) Insulation resistance, (3) Surge resistance, (4) Dielectric breakdown voltage, (5) Magnetic coupling coefficient and, (6) Quality factor. The thick film dielectric paste of this invention can be fired in air below 950° C. to manufacture flat miniature multilayer magnetic components with magnetic coupling coefficient greater than 0.95 and dielectric breakdown voltage greater than 500V/mil.

In the preferred embodiment of this invention the thick film dielectric paste is comprised of:

(a) 22 to 55% borosilicate glass powder with an average particle size in the range of 0.5 to 2 microns with softening point below 700° C. and coefficient of thermal expansion in the range of 8 to 11 ppm/° C., preferably 9 to 10 ppm/° C., (b) 22 to 55% inorganic filler (e.g. alumina, stabilized zirconia or zinc oxide) with an average particle size in the range of 0.5 to 2 microns and coefficient of thermal expansion in the range of 6 to 12 ppm/° C., (c) 0 to 10% inorganic flux (e.g. bismuth trioxide ($Bi_2O_3$), lead oxide (PbO), or low melting glasses (glasses with melting point below about 600 C.)) with an average particle size less than 10 microns, (d) 1 to 5% ethyl cellulose as resin and, (e) 14 to 35 % high boiling point alcohol as solvent.

In the preferred embodiment of this invention, room temperature (23° C. to 27° C.) viscosity of the thick film dielectric paste is in the range of 200 to 400 kcp at a shear rate of 1.05/sec, using a cylindrical spindle on Brookfield RVT viscometer.

The thick film dielectric paste is deposited in the desired layout or pattern by the screen-printing technique on either of the following inventions of this embodiment: the LTCC ferrite tape, the screen-printed and dried thick film ferrite paste deposit or the thick film buried silver conductor paste. Several paste and screen-printing related variable parameters such as concentration of solids in the paste, rheology of the paste, mesh count of the screen and thickness of the screen determine the quality or physical characteristics of the screen-printed dielectric film or print such as thickness and sharpness of the edges of the print.

In the preferred embodiment of this invention the thick film dielectric has magnetic permeability lower than that of the ferrite on which it is printed so as to redirect the magnetic flux through the bulk of the ferrite core of the miniature, multilayer magnetic component thereby enhancing its magnetic coupling coefficient to 0.95 or higher values (theoretical maximum being 1.0).

In the preferred embodiment of this invention the thick film dielectric electrically insulates adjacent thick film buried silver conductor lines thereby enhancing the dielectric breakdown voltage of the miniature, multilayer magnetic component to values greater than 500V/mil.

H. Sample Preparation, Test Procedures And Example

The dielectric and inductive characteristics of the materials system of this invention are evaluated using multilayer test parts fabricated in accordance with the typical LTCC and thick film manufacturing techniques. Fabrication of all test parts can be split into two distinct functions: (1) Preparation of the green multilayer package and (2) Firing of the green multilayer package.

Figure 1B:
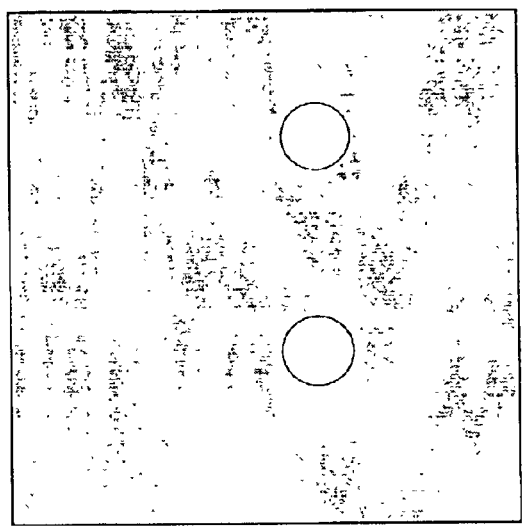
FIG. 1B shows a typical cut piece of LTCC ferrite tape with punched vias.
Figure 1C:
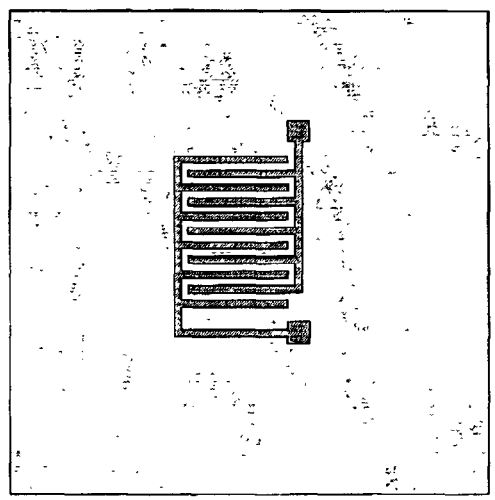
FIG. 1C shows a typical cut piece of the LTCC ferrite tape with screen-printed thick film silver conductor.
Figure 1D:
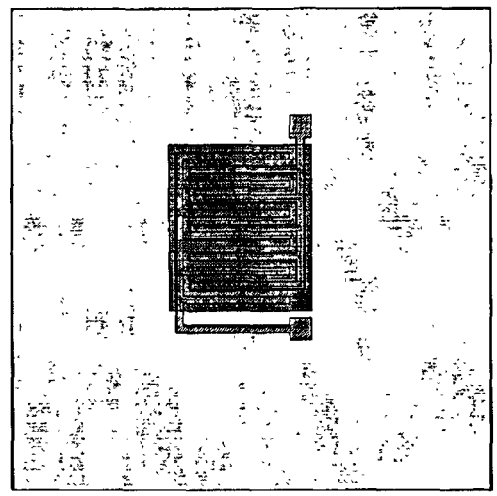
FIG. 1D a typical cut piece of the LTCC ferrite tape with the screen-printed thick film dielectric covering the screen-printed thick film silver conductor.

Preparation of the green multilayer package is along following typical processing steps. At the outset, as per the test part design the LTCC ferrite tape is cut to size (FIG. 1A). If called for in the test part design, via-holes are punched (FIG. 1B). Next the thick film silver conductor paste is screen-printed on the ferrite tape and dried in a laboratory oven at a temperature of 120° C. to 130° C. for duration of 5 to 10 minutes (FIG. 1C) . The layout of the silver conductor film depends on the characteristics to be evaluated. If called for in the test part design, the vias are filled with the via-fill thick film conductor. If called for in the test part design, the thick film dielectric paste is screen-printed over the dry silver conductor film (FIG. 1D). The screen-printed dielectric film is dried in a laboratory oven at a temperature of 120° C. to 130° C. for duration of 5 to 10 minutes. After completion of the screen-printing steps the parts are ready for lamination. In accordance with the test part design a combination of blank ferrite layers and screen-printed ferrite layers are stacked and laminated to form the green, multilayer test package comprised of buried silver conductor with and without the dielectric film. When preparing multilayer packages with the materials system of this invention the optimum laminating parameters are: 2 to 12 minutes at 1,000 to 2,000 PSI pressure and 65° C. to 75° C. temperature. The laminated package is then fired using a specific time-temperature firing protocol (firing profile) to form the finished test part.

In high temperature manufacturing process of microelectronic components using LTCC tapes and thick film pastes, the typical time-temperature firing profile can be classified into three broad processing phases: first, the heating phase from ambient to peak firing temperature followed by the soaking phase at peak temperature and lastly the cooling phase from peak temperature to ambient. With the onset of the heating phase, the organic constituents begin to burn-off leaving behind a porous compact of particulates of the inorganic solids supported by the setter-plate. This portion of the heating phase during which the organics burn-off is classified as the burn-off stage. The time span needed or allocated for burn-off stage depends on the amount of organics present in the materials being fired and ranges from a few minutes when firing just a single layer to several hours when firing a multilayer package. The maximum temperature used. in the burn-off stage depends on the type of organics used and may be as high as 650° C. During the remainder of the heating phase and continuing through the soaking phase at peak firing temperature the inorganic particulates interact with each other leading to sintering and densification of these constituents. These constituents may also react chemically leading to formation of new material phases that were not part of the original chemical composition. The soak time and peak firing temperature used depend on the physical and chemical properties of the inorganic constituents and the desired microelectronic properties and performance for intended application. With the onset of cooling phase the interaction between the inorganic constituents begins to slow down there by freezing the microstructure that imparts the electrical properties and performance characteristics to the finished or fired microelectronic component or test part.

The following examples are intended to further illustrate, not limit, the invention.

Example 1

Preparing a Component

A non-wire wound, miniature, multilayer magnetic circuit component was constructed using the starting materials and techniques described herein. The component contained ferrite tape, thick film buried silver conductor, thick film via-fill silver conductor, thick film solderable top layer silver conductor and thick film dielectric. Following table lists the sequence of processing steps used and describes the layer-by-layer design of the multilayer component. (In an actual device, there may be circuits on several layers. The examples of devices disclosed below had circuits on only one layer or on none of the layers, since they were used for testing purposes only.)

| Processing steps | Toroid for testing magnetic permeability | Multilayer part for testing dielectric properties of the ferrite tape | Multilayer part for evaluating the effect of thick film dielectric on the dielectric properties of the ferrite tape |
|---|---|---|---|
| 1st step: cut the ferrite tape to size | 10 pieces, each 1 in square | 10 pieces, each 1 in square | 10 pieces, each 1 in square |
| 2nd step: screen print and dry conductor | not applicable | thick film buried silver conductor on 1 piece of ferrite tape | thick film buried silver conductor on 1 piece of ferrite tape |
| 3rd step: screen print and dry dielectric | not applicable | not applicable | thick film dielectric on top of the dry silver print |
| 4th step: punch vias | not applicable | punch vias in 5 ferrite tape pieces | punch vias in 5 ferrite tape pieces |
| 5th step: laminate ferrite tape pieces at 1500 PSI for 5 min at 70 C. | align all 10 pieces | align ferrite tape pieces with vias on top of silver print and all other pieces below the silver print | align ferrite tape pieces with vias on top of silver print and all other pieces below the silver print |
| 6th step: punch to size Layer by layer design | punch to form a ring | not applicable | not applicable |
| 1st layer | ferrite tape | ferrite tape | ferrite tape |
| 2nd layer | ferrite tape | ferrite tape | ferrite tape |
| 3rd layer | ferrite tape | ferrite tape | ferrite tape |
| 4th layer | ferrite tape | ferrite tape | ferrite tape |
| 5th layer | ferrite tape | ferrite tape | ferrite tape |
| 6th layer | ferrite tape | thick film buried silver conductor | thick film buried silver conductor |
| 7th layer | ferrite tape | ferrite tape with vias | thick film dielectric |
| 8th layer | ferrite tape | ferrite tape with vias | ferrite tape with vias |
| 9th layer | ferrite tape | ferrite tape with vias | ferrite tape with vias |
| 10th layer | ferrite tape | ferrite tape with vias | ferrite tape with vias |
| 11th layer | not applicable | ferrite tape with vias | ferrite tape with vias |
| 12th layer | not applicable | not applicable | ferrite tape with vias |

Example 2

Firing the Component

A green multilayer package or magnetic component fabricated from the materials system of this invention can be fired using the following typical firing profile. Starting at room temperature, heat at a rate of 1° C./min to 3° C./min to the burn-off step temperature in the range 400° C. to 500° C. Hold at this burn-off step temperature for a duration of 15 minutes to 2 hours to facilitate optimum burn-off. Then continue heating at a rate faster than 4° C./min to the peak firing temperature in the range of 850° C. to 950° C. Hold or soak at the peak firing temperature for duration of 15 minutes to 4 hours depending on the desired properties for the finished or fired multilayer package or magnetic component. The preferred firing profile for the materials system of this invention is as follows: Starting at room temperature, heat at a rate of 2° C./min to the burn-off step temperature, 450° C. Hold at 450° C. for a duration of 2 hours. Then continue heating at a rate of 6° C./min to the peak firing temperature, 930° C. Soak at the 930° C. peak firing temperature for duration of 3 hours.

It will be evident to those knowledgeable in the art that during firing of LTCC multilayer packages the three important criteria in the selection of the time-temperature protocol are: (1) Selection of heating and cooling rates to allow fabrication of defect-free parts in minimal time, (2) Selection of time-temperature parameters for optimum burn-off and, (3) Selection of peak firing temperature and soak time at peak temperature for fabricating parts with desired optimum performance characteristics. Thus in the embodiment of this invention the time-temperature parameters selected to fabricated the miniature multilayer magnetic component are critical only in so far as the peak firing temperature is below 960° C. (preferably 875–915C.) when using thick film silver conductors with LTCC ferrite tapes.

Example 3

Testing Magnetic Permeability of Toroid

In this embodiment the magnetic permeability, $\mu_m$ is measured using a toroid fabricated from a multilayer laminate of the LTCC ferrite tape. Ten layers of the LTCC ferrite tape are laminated and by means of a punch and a die set a green multilayer ferrite-ring with an inside diameter of 0.25 inch and an outside diameter of 0.625 inch is fabricated and fired to form the magnetic core for the toroid test part. The three dimensions, inside diameter, ID, outside diameter, OD and, thickness, t of the fired ring are recorded. Next, ten loops of an insulted wire are wound around the ring to form the toroid test part. An insulated wire, 26 AWG solid silver-plated OFHC copper 0.0055 KYNAR is used for the toroid windings and to facilitate electrical connection to the test equipment. The inductance, L of the toroid test part is measured with Wayne Kerr (West Sussex, UK) Precision Magnetics Analyzer, Model PMA 3260A, operating at 10 mA, 500 kHz. The magnetic permeability, $\mu_m$ of the ferrite core is then given by the formula:

$\mu_m = (50 \times L)/G$ where, the inductance L is in micro-Henry and the Geometric Constant, G is a function of dimensions of the toroid and is defined by the formula:

$G = t \times \ln(OD/ID)$.

The magnetic permeability of the ferrite is influenced by the chemical composition of the ferrite as well the grain size of the ferrite characterized by the peak firing temperature used to fire the LTCC ferrite tape multilayer test part. The effect of ferrite chemistry and peak firing temperature on magnetic permeability is evaluated by fabricating toroid test parts with five different LTCC ferrite tape formulations, Tape A, Tape B, Tape C, Tape D and, Tape E fired at four different peak firing temperatures. Data presented in Table 1 shows that the magnetic permeability is higher at higher peak firing temperature (Peak T). The micrographs (all at the same magnification) presented in FIGS. 2A, 2B, 2C and, 2D show that the multilayer ferrite body with larger ferrite grain size has higher magnetic permeability, $\mu_m$.

Example 4

Testing Dielectric Properties of the Component of the Materials System of this Embodiment, the Dielectric In the miniature multilayer magnetic component applications characteristics of interest are: dielectric breakdown voltage, insulation resistance and, surge resistance. These characteristics are evaluated on a multilayer test part comprised of a thick film inter-digitated conductor sandwiched between layers of LTCC ferrite tape. Ten pieces, 1 inch wide by 1 inch long are cut from the LTCC ferrite tape. On one of these pieces, the thick film buried silver conductor paste is printed and dried. The screen-printed, inter-digitated conductor layout has 15-mil wide, 15-mil space silver lines, 169-squares long covering an area of 0.4 in×0.5 in. If called for in the test part design, the thick film dielectric paste is screen-printed and dried to cover most of the screen-printed and dried inter-digitated silver conductor film leaving the two conductor pads uncovered. Next, five of the cut ferrite pieces are punched with 0.125-inch diameter holes to facilitate electrical contact with the buried inter-digitated silver conductor. The five pieces of ferrite tape with holes are aligned and stacked on top of the screen-printed and dried silver conductor and the remaining four pieces of ferrite tape are aligned and stacked on the other side, underneath the silver conductor. This stack of aligned tapes is then laminated and fired to form a multilayer test part comprised of the thick film buried silver conductor sandwiched between five layers of the LTCC ferrite tape on each side of it. The dielectric break down voltage is measured using Clare Instruments Ltd. (Sussex, UK) Flash Tester, Model A203D/ 213. The insulation resistance is measured using the Hewlett-Packard High Resistance Meter, Model 4329A operating at 100VDC. The surge resistance of the multilayer test part is measured using Compliance Design, Inc., Universal Surge Generator, Model CDI-M5 equipped with a 2×10 μs/5000V/1000A wave-shape plug-in. This is a pass or fail test where in a 5000VDC power surge is applied to the test part. This power surge has the following wave-shape: rise or surge in 2 microseconds from 0 to 5000V peak open-circuit voltage followed by an exponential decay characterized by a drop to half of the peak value, from 5000V to 2500V in 10 microseconds. An acceptable test part can withstand this 5000VDC power surge.

In the materials system of this embodiment following factors have a major influence on the dielectric characteristics of interest: (1) Concentration of the sintering aid in the LTCC ferrite tape or the thick film ferrite paste, (2) Peak firing temperature of the multilayer package, (3) Concentration of solids in the thick film buried silver conductor paste, (4) Use of a grain growth inhibitor in the thick film buried silver conductor paste and, (5) Thickness of the dielectric film covering the buried silver conductor.

Example 5

Evaluating Impact of the Sintering Aid

In the preferred embodiment of this invention presence of a sintering aid in the ferrite helps densification of the ferrite matrix at peak firing temperatures below 950° C., essential for use of buried silver conductors. With multilayer test parts fired at peak firing temperature of 900° C., data reported in Table 2 shows that LTCC ferrite tape with more than 1% $Bi_2O_3$ as sintering aid has higher breakdown voltage compared to that for LTCC tapes with less than 1% of this sintering aid.

Example 6

Evaluating Impact of Peak Firing Temperature

With the materials system of this embodiment firing the LTCC ferrite tape multilayer test part at a higher peak firing temperature (Peak T) increases the magnetic permeability ($\mu_m$), dielectric breakdown voltage (BDV), insulation resistance (IR) and surge resistance (SR). Data reported in Table 3 shows that the multilayer test parts fired at peak temperature of 930° C. have higher $\mu_m$ BDV, IR and, SR than that for multilayer test parts fired at peak temperature of 885° C. This improved performance with higher peak firing temperature is most likely due to the higher degree of sintering and densification in the multilayer package.

Example 7

Evaluating Impact of Variations in Buried Silver Conductor Formulation

During high temperature processing of the multilayer package the interaction between the buried silver conductor and the ferrite results in diffusion of the silver into the ferrite matrix. The extent of such silver diffusion can be controlled by different means; one of them is lowering the amount of silver present in the buried film by reducing the concentration of solids in the conductor paste. Use of lower concentration of silver limits the amount of silver available for interaction with the ferrite there by potentially reducing any adverse effect such diffused silver may have on the dielectric characteristics of interest. In the materials system. of this embodiment reducing the concentration of solids in the thick film buried silver conductor paste results in an increase in dielectric breakdown voltage (BDV), insulation resistance (IR) and surge resistance (SR). With multilayer test parts fired at peak firing temperature of 930° C., data reported in Table 4 shows that parts fabricated with relatively lower concentration of solids in the thick film buried silver conductor paste have higher BDV, IR and, SR compared to that for parts fabricated with a relatively higher concentration of solids in the thick film buried silver conductor paste.

During high temperature processing of the multilayer package presence of a grain growth inhibitor in the silver conductor paste helps moderate activity of the silver particulates potentially limiting any detrimental interaction between the silver and the ferrite. In the materials system of this embodiment use of a grain growth inhibitor in the thick film buried silver conductor paste results in increased dielectric breakdown voltage (BDV), insulation resistance (IR) and surge resistance (SR) . With multilayer test parts fired at peak firing temperature of 930° C., data reported in Table 5 shows that parts fabricated with the thick film buried silver conductor containing a grain growth inhibitor have higher BDV, IR and, SR compared to that for parts fabricated with the buried thick film silver conductor without any grain growth inhibitor.

Example 8

Evaluating Impact of Variations in Thickness of Dielectric Films

A thicker dielectric film offers greater resistance to electrical breakdown. In the materials system of this embodiment with multilayer test parts fired at peak temperature of 930° C., data reported in Table 6 shows that a thicker dielectric film increases the dielectric breakdown voltage (BDV) and data reported in Table 7 shows that a thicker dielectric film increases the insulation resistance (IR).

In the test part design of this embodiment use of a 1-mil thick lower permeability dielectric to cover the buried inter-digitated silver conductor improves the dielectric characteristics of the multilayer test part; the dielectric breakdown voltage increases to values greater than 2000V and the insulation resistance increases to values greater than 1,000 MΩ. In miniature non wire-wound multilayer transformers this beneficial effect of low permeability dielectric film on top of the buried silver induction coil manifests itself with enhanced dielectric breakdown voltage to values greater than 1500V, comparable to conventional or traditional wire-wound miniature transformers.

The observed performance characteristics for the multilayer test parts and magnetic components are determined by materials related variables such as, chemistry and particle size, and process related variables such as peak firing temperature and soak-time. In the preferred embodiment of this invention key materials and process related variables are optimized so as to facilitate fabrication of miniature multilayer magnetic components with magnetic coupling coefficient greater than 0.95 and dielectric breakdown voltage greater than 500V/mil at peak firing temperature below 950° C. using typical multilayer microelectronic manufacturing techniques.

Those with expertise in this technology will recognize that that further variations of the above are contemplated within the disclosed invention.

TABLE 1

| | Magnetic Permeability, $\mu_m$ of LTCC ferrite tapes | | | | |
|---|---|---|---|---|---|
| Peak T | Tape A | Tape B | Tape C | Tape D | Tape E |
| 885° C. | 215 | 218 | 216 | 464 | 481 |
| 900° C. | 255 | 292 | 429 | 506 | 515 |
| 930° C. | 290 | 479 | 637 | 718 | 730 |
| 1030° C. | 440 | 689 | 761 | | |

TABLE 2

| Concentration of $Bi_2O_3$ in ferrite | BDV |
|---|---|
| less than 1% | 2000 V |
| greater than 1% | 4000 V |

TABLE 3

| Peak T | $\mu_m$ | BDV | IR | SR |
|---|---|---|---|---|
| 885° C. | 43 | 4000 V | 1,000 MΩ | Fail 5000 V |
| 930° C. | 73 | Above 5000 V | 100,000 MΩ | Pass 5000 V |

TABLE 4

| Relative concentration of solids in buried silver paste | BDV | IR | SR |
|---|---|---|---|
| High | 3100 V | 1,000 MΩ | Fail 5000 V |
| High | 3000 V | 50,000 MΩ | Fail 5000 V |
| Low | Above 5000 V | 80,000 MΩ | Pass, 5000 V |
| Low | Above 5000 V | 100,000 MΩ | Pass 5000 V |

TABLE 5

| Type of buried silver paste | BDV | IR | SR |
|---|---|---|---|
| Without grain growth inhibitor | 3000 V | 50 MΩ | Fail 5000 V |
| With grain growth inhibitor | Above 5000 V | 80 MΩ | Pass 5000 V |

TABLE 6

| Dielectric film thickness | BDV |
|---|---|
| 40 microns | 1360 V |
| 45 microns | 1700 V |
| 54 microns | 3312 V |
| 60 microns | 4400 V |

TABLE 7

| Dielectric film thickness | IR |
|---|---|
| 25 microns | 20,000 MΩ |
| 41 microns | 60,000 MΩ |
| 66 microns | 200,000 MΩ |

What is claimed is:

1. A materials system for manufacturing multilayer magnetic components comprising:
   (a) a magnetically permeable ferrite material selected from the group consisting of Low Temperature Cofire Ceramic (LTCC) ferrite tape and thick film ferrite paste,
   (b) metal conductor paste, wherein said metal conductor paste is disposed to be in contact with said ferrite material, and
   (c) thick film dielectric paste, wherein said film dielectric paste is disposed to be in contact with and cover said metal conductor, and wherein said ferrite material has a flux containing approximately 0.2–5 weight % $Bi_2O_3$, and further wherein said metal conductor paste comprises a metal selected from the group consisting of silver, gold, copper, palladium, platinum and alloys thereof.

2. The material system of claim 1 wherein said metal conductor paste comprises:
   a. a thick film buried silver conductor paste,
   b. a thick film via-fill silver conductor paste and
   c. a thick film solderable top layer silver conductor paste.

3. The material system of claim 2 wherein said thick film buried silver conductor paste has solids composition comprised by weight % of 93 to 100% silver, 0 to 3% grain growth inhibitor and 0 to 4% of a glass or binder.

4. The material system of claim 2 wherein said thick film via-fill silver conductor paste has solids composition comprised by weight % of 94 to 100% silver and 0 to 6% binder.

5. The material system of claim 2 wherein said thick film solderable top layer silver conductor paste has solids composition comprised by weight % of 81 to 97% silver, 2 to 7% platinum and, 1 to 12% binder.

6. The material system of claim 1 wherein said ferrite has solids composition in percent by weight comprising 84.8 to 98.8% Ni—Cu—Zn ferrite, 0.2 to 5% $Bi_2O_3$, 0 to 5% PbO, 0 to 15% filler and 0 to 10% glass binder.

7. The material system of claim 6 wherein said ferrite comprises by weight % approximately 5 to 10% Ni, 1 to 5% Cu, 10 to 20% Zn, and 0.1 to 5% PbO.

8. The material system of claim 1 wherein said ferrite comprises approximately 1 to 5 weight % $Bi_2O_3$.

9. The material system of claim 8 wherein said ferrite comprises approximately 1.25 to 3 weight % $Bi_2O_3$.

10. The material system of claim 1 wherein said thick film dielectric paste has solids composition comprised by weight % of 35 to 65% borosilicate glass and 35 to 6% filler.

11. The material system of claim 10 wherein said borosilicate glass has thermal expansion coefficient in the range of 8 to 11 ppm/° C. and softening point less than 700° C.

12. The material system of claim 1 which further comprises a grain growth inhibitor.

13. The material system of claim 1 wherein the thickness of said dielectric paste is between 20 and 70 microns.

14. The material system of claim 1 wherein said magnetic components have magnetic coupling coefficient greater than 0.95 and dielectric breakdown voltage greater than 500V/mil between elements.

15. The material system of claim 1 further comprising at least one registration hole formed in said ferrite material.

16. The material system of claim 1 further comprising at least one via hole formed in said ferrite material.

17. The material system of claim 16 wherein the at least one via hole is operable to provide for an electrical interconnect.

* * * * *

UNITED STATES PATENT AND TRADEMARK OFFICE
CERTIFICATE OF CORRECTION

PATENT NO. : 6,914,513 B1　　　　　　　　　　　　　　　　　　　　Page 1 of 1
APPLICATION NO. : 10/288940
DATED : July 5, 2005
INVENTOR(S) : Richard L. Wahlers et al.

It is certified that error appears in the above-identified patent and that said Letters Patent is hereby corrected as shown below:

Column 2, line 34, "v as" should read --vias--; and

Column 2, line 57, delete "U.S. Pat. Nos.".

Signed and Sealed this

Eighteenth Day of July, 2006

JON W. DUDAS
*Director of the United States Patent and Trademark Office*